United States Patent
Kim et al.

(10) Patent No.: US 9,202,556 B1
(45) Date of Patent: Dec. 1, 2015

(54) SEMICONDUCTOR DEVICES

(71) Applicant: SK hynix Inc., Icheon-si, Gyeonggi-do (KR)

(72) Inventors: Yeon Uk Kim, Icheon-si (KR); Jeong Tae Hwang, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/527,889

(22) Filed: Oct. 30, 2014

(30) Foreign Application Priority Data

Aug. 6, 2014 (KR) .................. 10-2014-0101321

(51) Int. Cl.
*G11C 11/41* (2006.01)
*G11C 11/418* (2006.01)
*G11C 17/18* (2006.01)
*G11C 17/16* (2006.01)

(52) U.S. Cl.
CPC .............. *G11C 11/418* (2013.01); *G11C 17/16* (2013.01); *G11C 17/18* (2013.01)

(58) Field of Classification Search
CPC ...... G11C 11/418; G11C 17/18; G11C 17/16; G11C 29/787; G11C 17/143; G11C 2229/763; G11C 2229/766; H01L 23/5252
See application file for complete search history.

(56) References Cited

U.S. PATENT DOCUMENTS

2008/0225566 A1  9/2008  Beattie et al.

FOREIGN PATENT DOCUMENTS

KR  1020140059684 A  5/2014

*Primary Examiner* — Richard Elms
*Assistant Examiner* — Ajay Ojha
(74) *Attorney, Agent, or Firm* — William Park & Associates Ltd.

(57) ABSTRACT

The semiconductor device includes a power control signal generator, a fuse controller and a fuse array portion. The power control signal generator generates a power control signal enabled during a predetermined period from a termination moment of a power-up period and enabled in response to a test mode signal. The fuse controller generates a boot-up signal enabled if a reboot-up signal is inputted during an enablement period of the power control signal. The fuse controller also generates a fuse reset signal enabled if a reset signal is inputted after a clock training operation. The fuse array portion generates a plurality of fuse data initialized if the fuse reset signal is enabled. The plurality of fuse data are programmed according to electrical open/short states of fuses in response to the power control signal.

20 Claims, 8 Drawing Sheets

SEMICONDUCTOR DEVICES

CROSS-REFERENCE TO RELATED APPLICATION

The present application claims priority under 35 U.S.C. 119(a) to Korean Application No. 10-2014-0101321, filed on Aug. 6, 2014, in the Korean Intellectual Property Office, which is incorporated herein by reference in its entirety as set forth in full.

BACKGROUND

1. Technical Field

Embodiments of the invention relate to semiconductor devices.

2. Related Art

The semiconductor device may operate in synchronization with a clock signal. In such a case, if a phase of a clock signal used in an external system for controlling the semiconductor device is not aligned with a phase of a clock signal used in the semiconductor device, operation errors may occur between the system and the semiconductor device operating at a high speed.

Accordingly, in order that the fast semiconductor device normally operates, a clock training operation may be executed to align the phase of the clock signal used in the fast semiconductor device with the phase of the system clock signal used in the external system at an initial operation stage of the fast semiconductor device.

SUMMARY

According to an embodiment, a semiconductor device includes a power control signal generator, a fuse controller and a fuse array portion. The power control signal generator is suitable to generate a power control signal enabled during a predetermined period from a termination moment of a power-up period and enabled in response to a test mode signal. The fuse controller is suitable to generate a boot-up signal enabled if a reboot-up signal is inputted during an enablement period of the power control signal. In addition, the fuse controller is suitable to generate a fuse reset signal enabled if a reset signal is inputted after a clock training operation. The fuse array portion is suitable to generate a plurality of fuse data initialized if the fuse reset signal is enabled. The plurality of fuse data are programmed according to electrical open/short states of fuses in response to the power control signal.

According to an embodiment, a semiconductor device includes a fuse controller and a fuse array portion. The fuse controller is suitable to generate a boot-up signal enabled in response to a reboot-up signal after a power-up period. In addition, the fuse controller is suitable to generate a fuse reset signal enabled if the boot-up signal is enabled or if a reset signal is inputted after a clock training operation. The fuse array portion is suitable to generate a plurality of fuse data initialized if the fuse reset signal is enabled. The plurality of fuse data are programmed according to electrical open/short states of fuses in response to a power control signal.

DETAILED DESCRIPTION

Embodiments of the invention will be described hereinafter with reference to the accompanying drawings. However, the embodiments described are for illustrative purposes only and not intended to limit the scope of the invention.

Figure 1:
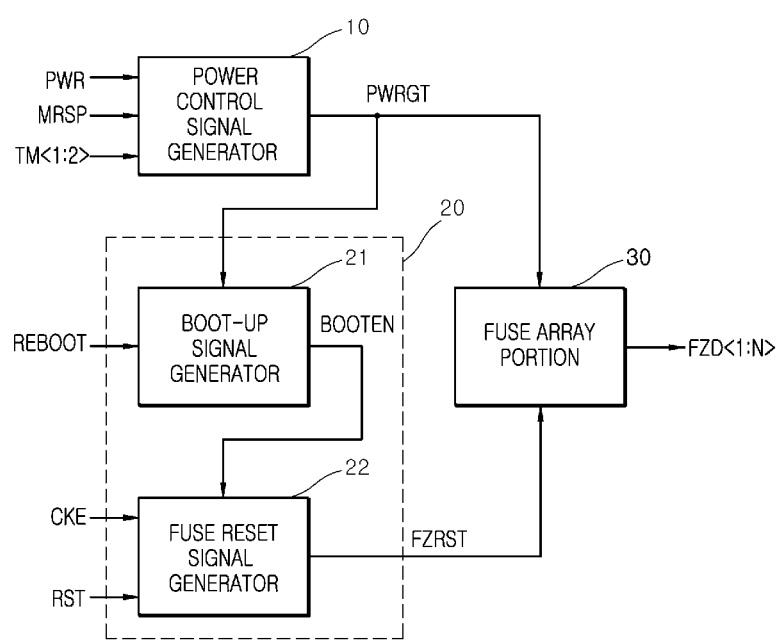
FIG. 1 is a block diagram illustrating a semiconductor device according to an embodiment of the invention.

Referring to FIG. 1, a block diagram illustrating a semiconductor device according to an embodiment of the invention is shown.

The semiconductor device according to an embodiment may include a power control signal generator 10, a fuse controller 20 and a fuse array portion 30.

The power control signal generator 10 may generate a power control signal PWRGT enabled from a point of time that a power-up signal PWR is enabled till a point of time that a mode set signal MRSP is enabled and is enabled in response to first and second test mode signals TM<1:2>. More specifically, the power control signal generator 10 may generate the power control signal PWRGT enabled during a predetermined period from a point of time that a power-up period terminates and is enabled by the first and second test mode signals TM<1:2>. The power-up signal PWR may be enabled at a termination moment of the power-up period that a power voltage signal VDD increases from a ground voltage level to a target voltage level. The mode set signal MRSP may be enabled after a predetermined period from a point of time that the power-up period terminates. In particular, the mode set signal MRSP may be enabled at a termination moment of a mode register set (MRS) operation that stores information to control internal operations of the semiconductor device into registers. In addition, the first test mode signal TM1 may be supplied from an external device or an external system to generate an internal voltage used in the fuse array portion 30. Further, the second test mode signal TM2 may be supplied from an external device or an external system to interrupt generation of the internal voltage used in the fuse array portion 30.

The fuse controller 20 may include a boot-up signal generator 21 and a fuse reset signal generator 22.

The boot-up signal generator 21 may generate a boot-up signal BOOTEN enabled if a reboot-up signal REBOOT is enabled while the power control signal PWRGT is enabled. The reboot-up signal REBOOT may be supplied from an external device or an external system to execute a boot-up operation that outputs fuse data FZD<1:N> generated according to electrical open/short states of fuses to an external device or an external system.

The fuse reset signal generator 22 may generate a fuse reset signal FZRST enabled if a rest signal RST is inputted while the boot-up signal BOOTEN or a clock enablement signal CKE is enabled. According to an embodiment, the clock enablement signal CKE may be set to be enabled at a point of time that a clock training operation to align a phase of a clock signal used in the semiconductor device with a phase of a system clock signal terminates. However, in various embodiments, the clock enablement signal CKE may be set to execute a specific operation of the semiconductor device. The rest signal RST may be supplied from an external device or an external system to initialize the semiconductor device.

The fuse array portion 30 may output the fuse data FZD<1:N> initialized if the fuse reset signal FZRST is enabled. In addition, while the power control signal PWRGT is enabled, the fuse array portion 30 may execute the boot-up operation to output the fuse data FZD<1:N> generated according to electrical open/short states of the fuses. The boot-up operation may be an operation that outputs the fuse data FZD<1:N> programmed according to electrical open/short states of the fuses in the fuse array portion 30 to include information to control an internal operation of the semiconductor device.

Figure 2:
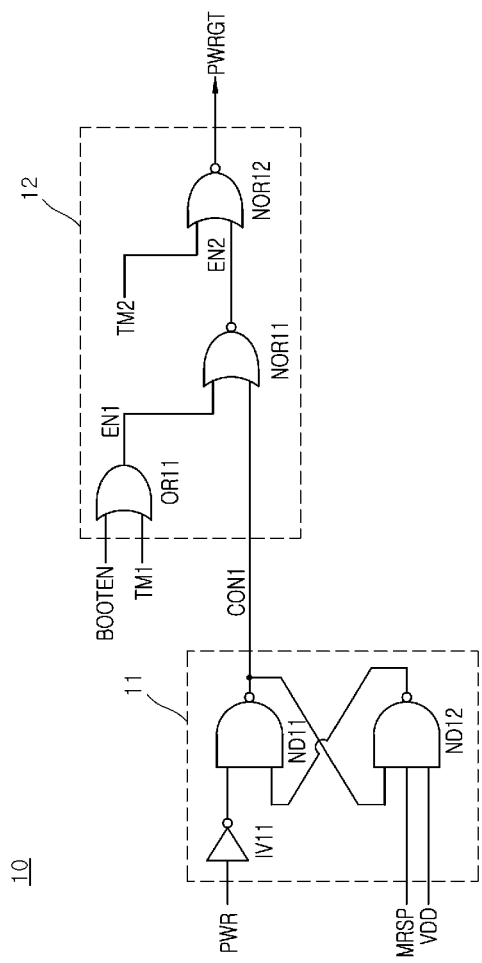
FIG. 2 is a logic circuit diagram illustrating a power control signal generator included in the semiconductor device of FIG. 1.

Referring to FIG. 2, the power control signal generator 10 may include a first latch unit 11 and a first logic unit 12.

The first latch unit 11 may include an inverter IV11, a NAND gate ND11 and a NAND gate ND12. The inverter IV11 may invert a logic level of the power-up signal PWR. The NAND gate ND11 may execute a NAND operation of an output signal of the inverter IV11 and an output signal of the NAND gate ND12 to generate a first control signal CON1. The NAND gate ND12 may execute a NAND operation of the first control signal CON1, the mode set signal MRSP and the power voltage signal VDD to output the NAND operation result. More specifically, the first latch unit 11 may generate the first control signal CON1 enabled to have a logic "high" level at a point of time that the power-up period terminates and disabled to have a logic "low" level after a predetermined period from a point of time that the power-up period terminates.

The first logic unit 12 may include a first logic element OR11, a second logic element NOR11 and a third logic element NOR12. The first logic element OR11 may be realized using a OR gate that generates a first enablement signal EN1 enabled if at least one of the boot-up signal BOOTEN and the first test mode signal TM1 is enabled. The second logic element NOR11 may be realized using a NOR gate that executes a NOR operation of the first control signal CON1 and the first enablement signal EN1 to generate a second enablement signal EN2. The third logic element NOR12 may be realized using a NOR gate that executes a NOR operation of the second test mode signal TM2 and the second enablement signal EN2 to generate the power control signal PWRGT. More specifically, the first logic unit 12 may generate the power control signal PWRGT enabled if the first control signal CON1 is enabled to have a logic "high" level, which is enabled if at least one of the boot-up signal BOOTEN and the first test mode signal TM1 is enabled. Alternatively, the power control signal PWRGT may be disabled if the second test mode signal TM2 is enabled to have a logic "high" level.

Figure 3:
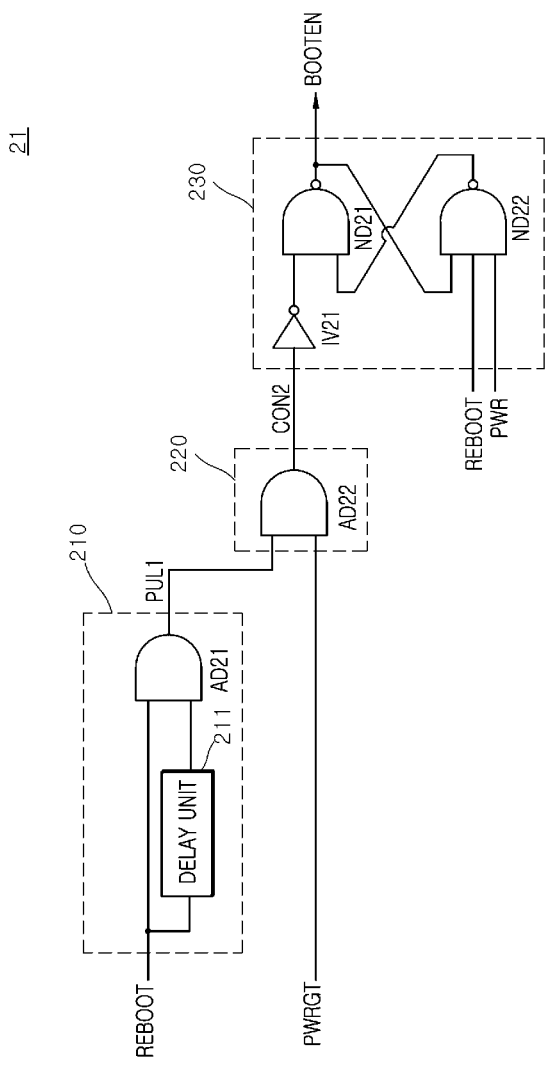
FIG. 3 is a logic circuit diagram illustrating a boot-up signal generator included in the semiconductor device of FIG. 1.

Referring to FIG. 3, the boot-up signal generator 21 may include a first pulse signal generator 210, a second logic unit 220 and a second latch unit 230.

The first pulse signal generator 210 may include a delay unit 211 and an AND gate AD21. The delay unit 211 may retard the reboot-up signal REBOOT by a predetermined phase, for example, a phase of 180 degrees. The AND gate AD21 may execute an AND operation of the reboot-up signal REBOOT and an output signal of the delay unit 211 to generate a first pulse signal PUL1. More specifically, the first pulse signal generator 210 may generate the first pulse signal PUL1 having a pulse width that corresponds to a delay time of the delay unit 211 from a point of time that the reboot-up signal REBOOT having a logic "high" level is inputted.

The second logic unit 220 may be realized using an AND gate AD22 that executes an AND operation of the power control signal PWRGT and the first pulse signal PUL1 to generate a second control signal CON2. In particular, the second logic unit 220 may generate the second control signal CON2 enabled if a pulse of the first pulse signal PUL1 is inputted while the power control signal PWRGT is enabled to have a logic "high" level.

The second latch unit 230 may include an inverter IV21, a NAND gate ND21 and a NAND gate ND22. The inverter IV21 may invert a logic level of the second control signal CON2. The NAND gate ND21 may execute a NAND operation of an output signal of the inverter IV21 and an output signal of the NAND gate ND22 to generate the boot-up signal BOOTEN. The NAND gate ND22 may execute a NAND operation of the boot-up signal BOOTEN, the reboot-up signal REBOOT and the power-up signal PWR to output the NAND operation result. More specifically, the second latch unit 230 may generate the boot-up signal BOOTEN enabled if the second control signal CON2 having a logic "high" level is inputted.

Figure 4:
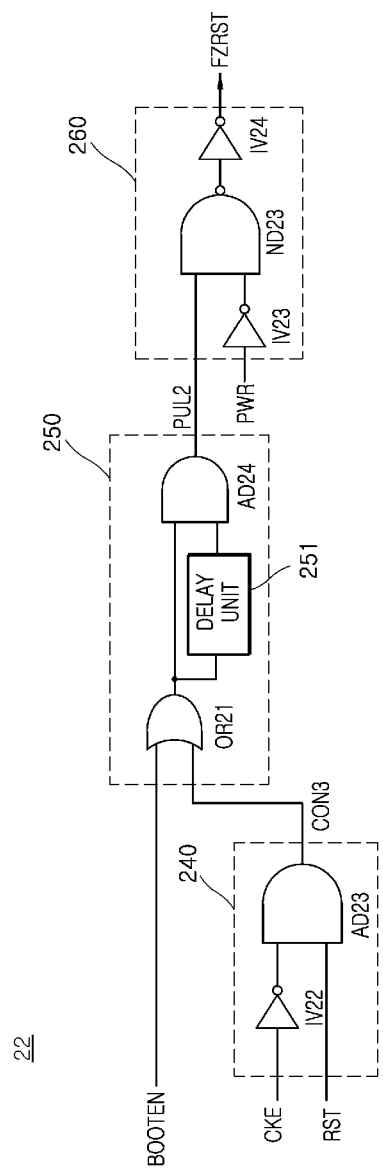
FIG. 4 is a logic circuit diagram illustrating a fuse reset signal generator included in the semiconductor device of FIG. 1.

Referring to FIG. 4, the fuse reset signal generator 22 may include a third logic unit 240, a second pulse signal generator 250 and a fourth logic unit 260.

The third logic unit 240 may include an inverter IV22 and an AND gate AD23. The inverter IV22 may invert a logic level of the clock enablement signal CKE. In addition, the AND gate AD23 may execute an AND operation of an output signal of the inverter IV22 and the reset signal RST to generate a third control signal CON3. More specifically, the third logic unit 240 may generate the third control signal CON3 enabled to have a logic "high" level if the clock enablement signal CKE is enabled to have a logic "low" level and the reset signal RST is enabled to have a logic "high" level.

The second pulse signal generator 250 may include an OR gate OR21, a delay unit 251 and an AND gate AD24. The OR gate OR21 may execute an OR operation of the boot-up signal BOOTEN and the third control signal CON3 to output the OR operation result. The delay unit 251 may retard an output signal of the OR gate OR21 by a predetermined phase, for example, a phase of 180 degrees. The AND gate AD24 may execute an AND operation of an output signal of the OR gate OR21 and an output signal of the delay unit 251 to generate a second pulse signal PUL2. In particular, the second pulse signal generator 250 may generate the second pulse signal PUL2 having a pulse width that corresponds to a delay time of the delay unit 251 from a point of time that the third control signal CON3 having a logic "high" level is inputted.

The fourth logic unit 260 may include an inverter IV23, a NAND gate ND23 and an inverter IV24. The inverter IV23 may invert a logic level of the power-up signal PWR. The NAND gate ND23 may execute a NAND operation of an output signal of the inverter IV23 and the second pulse signal PUL2 to output the NAND operation result. The inverter IV24 may invert a logic level of an output signal of the NAND gate ND23 to generate the fuse reset signal FZRST. More specifically, the fourth logic unit 260 may generate the fuse reset signal FZRST enabled if the power-up signal PWR is enabled to have a logic "low" level and a pulse of the second pulse signal PUL2 is inputted.

Figure 5:
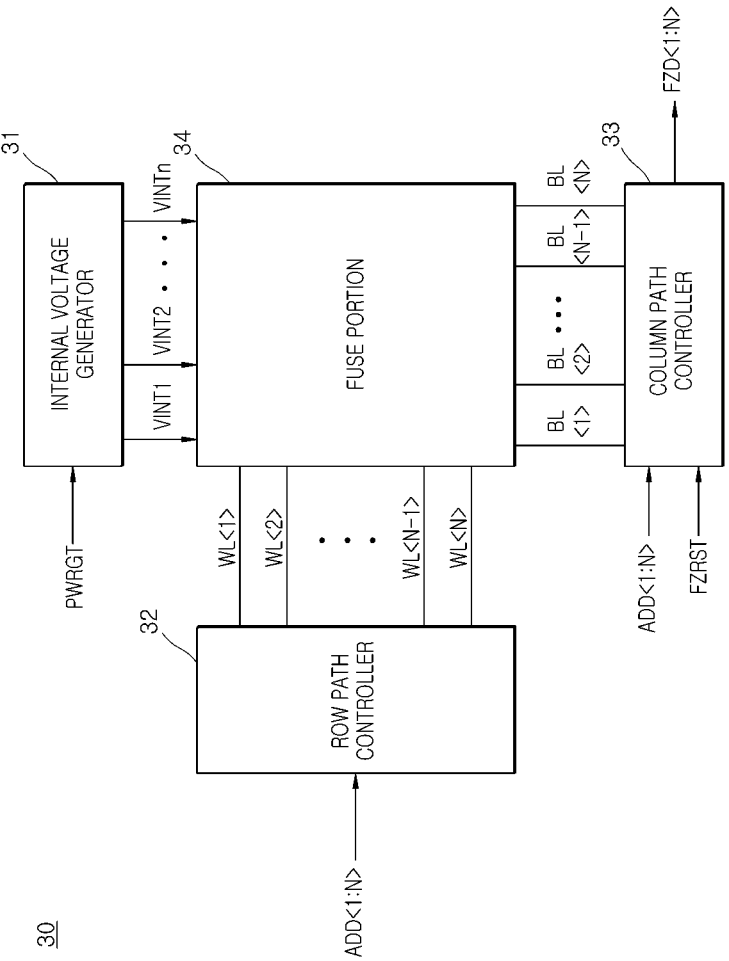
FIG. 5 is a block diagram illustrating a fuse array portion included in the semiconductor device of FIG. 1.

Referring to FIG. 5, the fuse array portion 30 may include an internal voltage generator 31, a row path controller 32, a column path controller 33 and a fuse portion 34.

The internal voltage generator 31 may generate a plurality of internal voltage signals VINT1, VINT2, . . . , and VINTn used in the fuse array portion 30 while the power control signal PWRGT is enabled. The plurality of internal voltage signals VINT1, VINT2, . . . , and VINTn may be used to cut the fuses in the fuse array portion 30 or to output the fuse data FZD<1:N> generated in the fuse array portion 30.

The row path controller 32 may select one of a plurality of word lines WL<1:N> according to a level combination of address signals ADD<1:N>.

The column path controller 33 may initialize the fuse data FZD<1:N> if the fuse reset signal FZRST is enabled. The column path controller 33 may also select one of a plurality of bit lines BL<1:N> according to a level combination of the address signals ADD<1:N>. In addition, the column path controller 33 may sense and amplify data on the selected bit line of the bit lines BL<1:N> to generate one of the fuse data FZD<1:N>.

The fuse portion 34 may include a plurality of fuses (not shown) electrically coupled to the plurality word lines WL<1:N> and the plurality of bit lines BL<1:N>. Each of the fuses may be realized using an e-fuse.

As described above, the fuse array portion 30 may initialize the fuse data FZD<1:N> if the fuse reset signal FZRST is enabled and may execute the boot-up operation while the power control signal PWRGT is enabled. Moreover, the fuse array portion 30 may generate the fuse data FZD<1:N> by electrically cutting the fuses selected by a logic level combination of the address signals ADD<1:N>.

Figure 6:
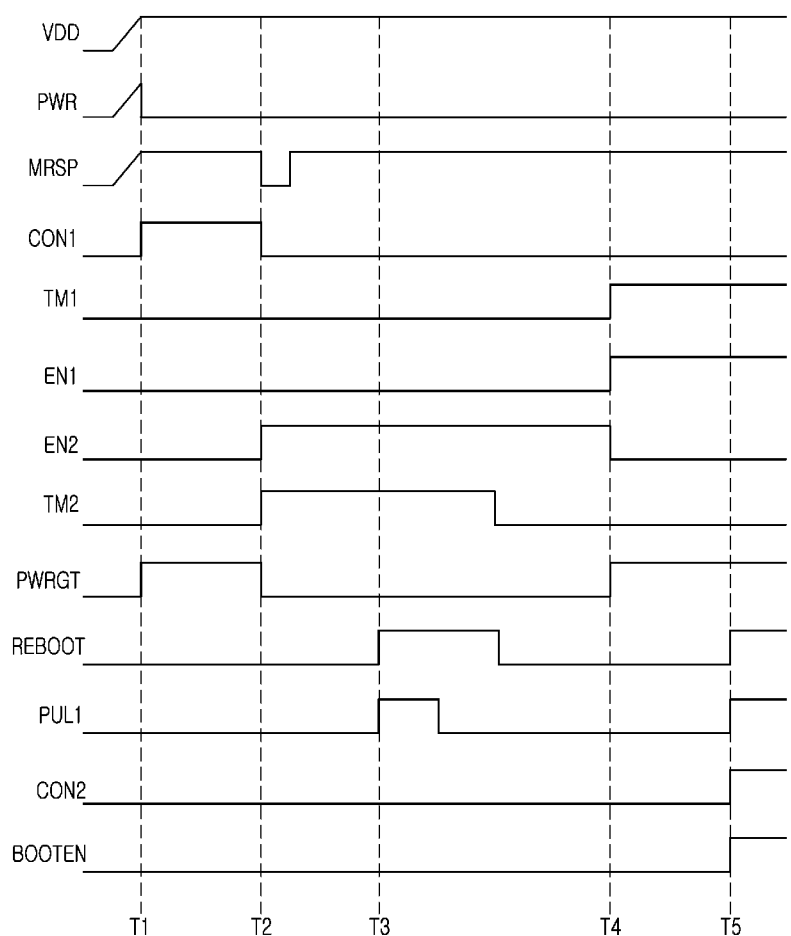
FIGS. 6 and 7 are timing diagrams illustrating operations of a semiconductor device according to an embodiment of the invention.

An operation of the semiconductor device having the aforementioned configuration will be described with reference to FIG. 6 in conjunction with an example in which the reboot-up signal REBOOT is inputted while generation of the internal voltage signals VINT1~VINTn is interrupted in the boot-up operation executed after the power-up period. In addition, an example in which the reboot-up signal REBOOT is inputted while the internal voltage signals VINT1~VINTn are generated in the boot-up operation executed after the power-up period is also described.

First, if the power voltage signal VDD reaches a target voltage level at time "T1," the power-up period may terminate and the power-up signal PWR is enabled to have a logic "low" level. In addition, the mode set signal MRSP is generated to have a level of the power voltage signal VDD.

The first latch unit 11 of the power control signal generator 10 may receive the power-up signal PWR having a logic "low" level, the power voltage signal VDD having a target voltage level and the mode set signal MRSP having the power voltage signal VDD level to generate the first control signal CON1 enabled to have a logic "high" level. The first logic element OR11 of the first logic unit 12 may receive the boot-up signal BOOTEN having a logic "low" level and the first test mode signal TM1 having a logic "low" level to generate the first enablement signal EN1 having a logic "low" level. The second logic element NOR11 may receive the first control signal CON1 having a logic "high" level and the first enablement signal EN1 having a logic "low" level to generate the second enablement signal EN2 having a logic "low" level. The third logic element NOR12 may receive the second test mode signal TM2 having a logic "low" level and the second enablement signal EN2 having a logic "low" level to generate the power control signal PWRGT enabled to have a logic "high" level.

The first pulse signal generator 210 of the boot-up signal generator 21 may receive the reboot-up signal REBOOT having a logic "low" level to generate the first pulse signal PUL1 having a logic "low" level. The second logic unit 220 may receive the first pulse signal PUL1 having a logic "low" level and the power control signal PWRGT having a logic "high" level to generate the second control signal CON2 having a logic "low" level. The second latch unit 230 may receive the second control signal CON2 having a logic "low" level. The second latch unit 230 may also receive the reboot-up signal REBOOT having a logic "low" level and the power-up signal PWR having a logic "low" level to generate the boot-up signal BOOTEN having a logic "low" level.

The fuse reset signal generator 22 may receive the boot-up signal BOOTEN having a logic "low" level to generate the fuse reset signal FZRST having a logic "low" level. An operation of the fuse reset signal generator 22 will be described more fully with reference to FIG. 7.

The internal voltage generator 31 of the fuse array portion 30 may receive the power control signal PWRGT having a logic "high" level to generate the plurality of internal voltage signals VINT1, VINT2, . . . , and VINTn. The row path controller 32 may select one of the plurality of word lines WL<1:N> according to a level combination of the address signals ADD<1:N>. The column path controller 33 may select one of the plurality of bit lines BL<1:N> according to a level combination of the address signals ADD<1:N>. In addition, the column path controller 33 may sense and amplify the data on the selected bit line of the bit lines BL<1:N> to generate one of the fuse data FZD<1:N>. More specifically, the fuse array portion 30 may receive the power control signal PWRGT enabled to have a logic "high" level to execute the boot-up operation. Further, the fuse array portion 30 may generate the fuse data FZD<1:N> according to electrical open/short states of the fuses selected by level combinations of the address signals ADD<1:N>.

Next, at time "T2" that a predetermined period elapses from the time "T1" corresponding to an termination moment of the power-up period, the mode set signal MRSP having a logic "low" level may be inputted to the power control signal generator 10. Further, the second test mode signal TM2 having a logic "high" level may be inputted to the power control signal generator 10 to execute an operation to interrupt generation of the internal voltage signals VINT1, VINT2, . . . , and VINTn.

The first latch unit 11 of the power control signal generator 10 may receive the power-up signal PWR having a logic "low" level. The first latch unit 11 may also receive the power voltage signal VDD having a target voltage level and the mode set signal MRSP having a logic "low" level to generate the first control signal CON1 disabled to have a logic "low" level. The first logic element OR11 of the first logic unit 12 may receive the boot-up signal BOOTEN having a logic "low" level and the first test mode signal TM1 having a logic "low" level to generate the first enablement signal EN1 having a logic "low" level. The second logic element NOR11 may receive the first control signal CON1 having a logic "low" level and the first enablement signal EN1 having a logic "low" level to generate the second enablement signal EN2 having a logic "high" level. The third logic element NOR12 may receive the second test mode signal TM2 having a logic "high" level and the second enablement signal EN2 having a logic "high" level to generate the power control signal PWRGT disabled to have a logic "low" level.

The first pulse signal generator 210 of the boot-up signal generator 21 may receive the reboot-up signal REBOOT having a logic "low" level to generate the first pulse signal PUL1 having a logic "low" level. The second logic unit 220 may receive the first pulse signal PUL1 having a logic "low" level and the power control signal PWRGT having a logic "low" level to generate the second control signal CON2 having a logic "low" level. The second latch unit 230 may receive the second control signal CON2 having a logic "low" level. The second latch unit 230 may also receive the reboot-up signal REBOOT having a logic "low" level and the power-up signal PWR having a logic "low" level to generate the boot-up signal BOOTEN having a logic "low" level.

The fuse reset signal generator 22 may receive the boot-up signal BOOTEN having a logic "low" level to generate the fuse reset signal FZRST having a logic "low" level. An operation of the fuse reset signal generator 22 will be described with reference to FIG. 7.

The internal voltage generator 31 of the fuse array portion 30 may receive the power control signal PWRGT having a logic "low" level to terminate the generation of the plurality of internal voltage signals VINT1, VINT2, . . . , and VINTn. More specifically, the fuse array portion 30 does not execute the boot-up operation at time "T2."

Next, the reboot-up signal REBOOT having a logic "high" level may be inputted to the boot-up signal generator 21 at time "T3" while the generation of the plurality of internal voltage signals VINT1, VINT2, . . . , and VINTn is interrupted.

The first latch unit 11 of the power control signal generator 10 may receive the power-up signal PWR having a logic "low" level. Further, the first latch unit 11 may receive the power voltage signal VDD having a target voltage level and the mode set signal MRSP having the power voltage signal VDD level to generate the first control signal CON1 which is disabled to have a logic "low" level. The first logic element OR11 of the first logic unit 12 may receive the boot-up signal BOOTEN having a logic "low" level and the first test mode signal TM1 having a logic "low" level to generate the first enablement signal EN1 having a logic "low" level. The second logic element NOR11 may receive the first control signal CON1 having a logic "low" level and the first enablement signal EN1 having a logic "low" level to generate the second enablement signal EN2 having a logic "high" level. The third logic element NOR12 may receive the second test mode signal TM2 having a logic "high" level and the second enablement signal EN2 having a logic "high" level to generate the power control signal PWRGT which is disabled to have a logic "low" level.

The first pulse signal generator 210 of the boot-up signal generator 21 may receive the reboot-up signal REBOOT having a logic "high" level to generate the first pulse signal PUL1 having a logic "high" level. The second logic unit 220 may receive the first pulse signal PUL1 having a logic "high" level and also the power control signal PWRGT having a logic "low" level to generate the second control signal CON2 having a logic "low" level. The second latch unit 230 may receive the second control signal CON2 having a logic "low" level. Further, the second latch unit 230 may receive the reboot-up signal REBOOT having a logic "high" level and the power-up signal PWR having a logic "low" level to generate the boot-up signal BOOTEN having a logic "low" level.

The fuse reset signal generator 22 may receive the boot-up signal BOOTEN having a logic "low" level to generate the fuse reset signal FZRST having a logic "low" level. An operation of the fuse reset signal generator 22 will be described in more detail with reference to FIG. 7.

The internal voltage generator 31 of the fuse array portion 30 may receive the power control signal PWRGT having a logic "low" level to terminate the generation of the plurality of internal voltage signals VINT1, VINT2, . . . , and VINTn. More specifically, the fuse array portion 30 does not execute the boot-up operation at time "T3."

Next, if an operation for generating the internal voltage signals VINT1, VINT2, . . . , and VINTn is executed at time "T4," the first test mode signal TM1 having a logic "high" level may be inputted to the power control signal generator 10.

The first latch unit 11 of the power control signal generator 10 may receive the power-up signal PWR having a logic "low" level, the power voltage signal VDD having a target voltage level and the mode set signal MRSP having the power voltage signal VDD level to generate the first control signal CON1 which is disabled to have a logic "low" level. The first logic element OR11 of the first logic unit 12 may receive the boot-up signal BOOTEN having a logic "low" level and the first test mode signal TM1 having a logic "high" level to generate the first enablement signal EN1 having a logic "high" level. The second logic element NOR11 may receive the first control signal CON1 having a logic "low" level and the first enablement signal EN1 having a logic "high" level to generate the second enablement signal EN2 having a logic "low" level. The third logic element NOR12 may receive the second test mode signal TM2 having a logic "low" level and also the second enablement signal EN2 having a logic "low" level to generate the power control signal PWRGT which is enabled to have a logic "high" level.

The first pulse signal generator 210 of the boot-up signal generator 21 may receive the reboot-up signal REBOOT having a logic "low" level to generate the first pulse signal PUL1 having a logic "low" level. The second logic unit 220 may receive the first pulse signal PUL1 having a logic "low" level and the power control signal PWRGT having a logic "high" level to generate the second control signal CON2 having a logic "low" level. The second latch unit 230 may receive the second control signal CON2 having a logic "low" level. In addition, the second latch unit 230 may also receive the reboot-up signal REBOOT having a logic "low" level and the power-up signal PWR having a logic "low" level to generate the boot-up signal BOOTEN having a logic "low" level.

The fuse reset signal generator 22 may receive the boot-up signal BOOTEN having a logic "low" level to generate the fuse reset signal FZRST having a logic "low" level. An operation of the fuse reset signal generator 22 will be described in further detail with reference to FIG. 7.

The internal voltage generator 31 of the fuse array portion 30 may receive the power control signal PWRGT having a logic "high" level to generate the plurality of internal voltage signals VINT1, VINT2, . . . , and VINTn. The row path controller 32 may select one of the plurality of word lines WL<1:N> according to a level combination of the address signals ADD<1:N>. The column path controller 33 may select one of the plurality of bit lines BL<1:N> according to a level combination of the address signals ADD<1:N>. In addition, the column path controller 33 may sense and amplify the data on the selected bit line of the bit lines BL<1:N> to generate one of the fuse data FZD<1:N>. More specifically, the fuse array portion 30 may receive the power control signal PWRGT enabled to have a logic "high" level to execute the boot-up operation and may generate the fuse data FZD<1:N> according to electrical open/short states of the fuses which are selected by level combinations of the address signals ADD<1:N>.

Next, the reboot-up signal REBOOT having a logic "high" level may be inputted to the boot-up signal generator 21 at time "T5" while the plurality of internal voltage signals VINT1, VINT2, . . . , and VINTn are generated.

The first latch unit 11 of the power control signal generator 10 may receive the power-up signal PWR having a logic "low" level. In addition, the first latch unit 11 may receive the power voltage signal VDD having a target voltage level and the mode set signal MRSP having the power voltage signal VDD level to generate the first control signal CON1 which is disabled to have a logic "low" level. The first logic element OR11 of the first logic unit 12 may receive the boot-up signal BOOTEN having a logic "low" level and the first test mode signal TM1 having a logic "high" level to generate the first enablement signal EN1 having a logic "high" level. The second logic element NOR11 may receive the first control signal CON1 having a logic "low" level and the first enablement signal EN1 having a logic "high" level to generate the second enablement signal EN2 having a logic "low" level. The third logic element NOR12 may receive the second test mode signal TM2 having a logic "low" level and the second enablement signal EN2 having a logic "low" level to generate the power control signal PWRGT which is enabled to have a logic "high" level.

The first pulse signal generator 210 of the boot-up signal generator 21 may receive the reboot-up signal REBOOT having a logic "high" level to generate the first pulse signal PUL1 having a logic "high" level. The second logic unit 220 may receive the first pulse signal PUL1 having a logic "high" level and the power control signal PWRGT having a logic "high" level to generate the second control signal CON2 having a logic "high" level. The second latch unit 230 may receive the second control signal CON2 having a logic "high" level. Moreover, the second latch unit 230 may receive the reboot-up signal REBOOT having a logic "high" level and the power-up signal PWR having a logic "low" level to generate the boot-up signal BOOTEN having a logic "high" level.

The fuse reset signal generator 22 may receive the boot-up signal BOOTEN having a logic "high" level to generate the fuse reset signal FZRST having a logic "high" level. An operation of the fuse reset signal generator 22 will be described in greater detail with reference to FIG. 7.

The internal voltage generator 31 of the fuse array portion 30 may receive the power control signal PWRGT having a logic "high" level to generate the plurality of internal voltage signals VINT1, VINT2, . . . , and VINTn. The row path controller 32 may select one of the plurality of word lines WL<1:N> according to a level combination of the address signals ADD<1:N>. The column path controller 33 may receive the fuse reset signal FZRST having a logic "high" level to initialize the fuse data FZD<1:N>. Further, the column path controller 33 may select one of the plurality of bit lines BL<1:N> according to a level combination of the address signals ADD<1:N>. Moreover, the column path controller 33 may sense and amplify the data on the selected bit line of the bit lines BL<1:N> to generate one of the fuse data FZD<1:N>. More specifically, the fuse array portion 30 may initialize the fuse data FZD<1:N> in response to the fuse reset signal FZRST enabled to a logic "high" level to change the fuse data FZD<1:N>.

The semiconductor device having the aforementioned configuration may execute the boot-up operation only during an enablement period of the power control signal PWRGT to generate the internal voltage signals VINT1, VINT2, . . . , and VINTn used in the fuse array portion 30. Accordingly, the boot-up operation may be stably executed.

Figure 7:
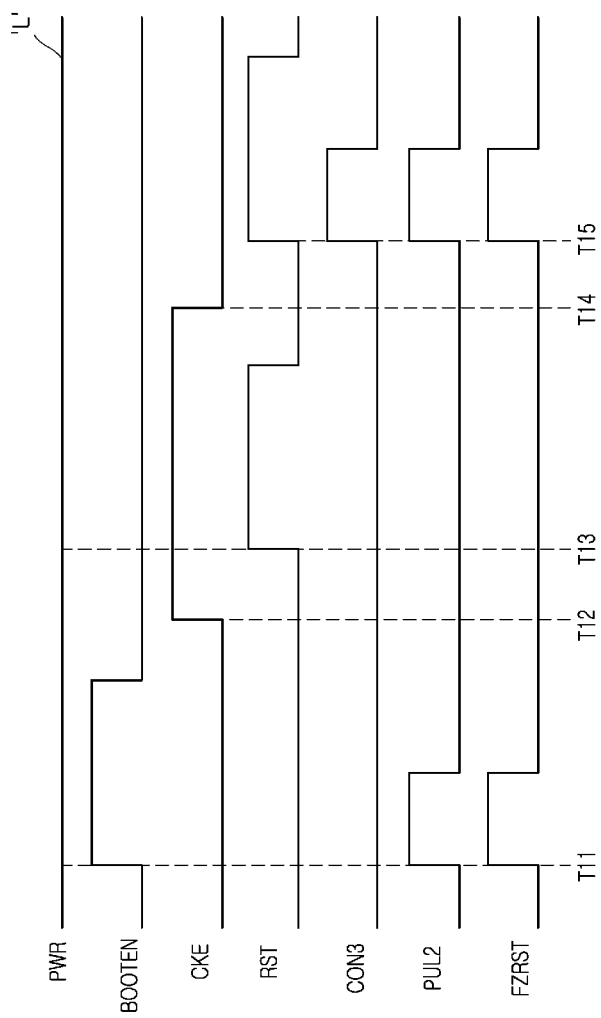

An operation of the semiconductor device having the aforementioned configuration will be described with reference to FIG. 7 in conjunction with an example in which the fuse data FZD<1:N> are initialized by the boot-up signal BOOTEN. Further, an example will be shown in which the fuse data FZD<1:N> are initialized by the reset signal RST which is supplied from an external device (or an external system) according to a level of the clock enablement signal CKE.

First, if the boot-up signal BOOTEN is enabled to have a logic "high" level at time "T11," the third logic unit 240 of the fuse reset signal generator 22 may receive the clock enablement signal CKE having a logic "low" level and the reset signal RST having a logic "low" level to generate the third control signal CON3 having a logic "low" level. The second pulse signal generator 250 may receive the boot-up signal BOOTEN having a logic "high" level and the third control signal CON3 having a logic "low" level to generate the second pulse signal PUL2 having a logic "high" level. The fourth logic unit 260 may receive the second pulse signal PUL2 having a logic "high" level and the power-up signal PWR having a logic "low" level to generate the fuse reset signal FZRST having a logic "high" level.

The internal voltage generator 31 of the fuse array portion 30 may generate the plurality of internal voltage signals VINT1, VINT2, . . . , and VINTn. The row path controller 32 may select one of the plurality of word lines WL<1:N> according to a level combination of the address signals ADD<1:N>. The column path controller 33 may receive the fuse reset signal FZRST having a logic "high" level to initialize the fuse data FZD<1:N>. In addition, the column path controller 33 may select one of the plurality of bit lines BL<1:N> according to a level combination of the address signals ADD<1:N>. Moreover, the column path controller 33 may sense and amplify the data on the selected bit line of the bit lines BL<1:N> to generate one of the fuse data FZD<1:N>. More specifically, the fuse array portion 30 may output the fuse data FZD<1:N> which are regenerated to have new information.

Next, at time "T12," the clock training operation may be executed to enable the clock enablement signal CKE supplied from an external device (or an external system) to a logic "high" level.

Next, if the reset signal RST is enabled to have a logic "high" level at time "T13," the third logic unit 240 of the fuse reset signal generator 22 may receive the clock enablement signal CKE having a logic "high" level and the reset signal RST having a logic "high" level to generate the third control signal CON3 having a logic "low" level. The second pulse signal generator 250 may receive the boot-up signal BOOTEN having a logic "low" level and the third control signal CON3 having a logic "low" level to generate the second pulse signal PUL2 having a logic "low" level. The fourth logic unit 260 may receive the second pulse signal PUL2 having a logic "low" level and the power-up signal PWR having a logic "low" level to generate the fuse reset signal FZRST having a logic "low" level.

The internal voltage generator 31 of the fuse array portion 30 may generate the plurality of internal voltage signals VINT1, VINT2, . . . , and VINTn. The row path controller 32 may select one of the plurality of word lines WL<1:N> according to a level combination of the address signals ADD<1:N>. The column path controller 33 may receive the fuse reset signal FZRST having a logic "low" level not to initialize the fuse data FZD<1:N>. More specifically, the fuse array portion 30 may output the fuse data FZD<1:N> which are unchanged.

Next, at time "T14," the clock training operation may terminate to disable the clock enablement signal CKE supplied from an external device (or an external system) to a logic "low" level.

Next, if the reset signal RST having a logic "high" level is inputted to the fuse reset signal generator 22 at time "T15," the third logic unit 240 of the fuse reset signal generator 22 may receive the clock enablement signal CKE having a logic "low" level and the reset signal RST having a logic "high"

level to generate the third control signal CON3 having a logic "high" level. The second pulse signal generator 250 may receive the boot-up signal BOOTEN having a logic "low" level and the third control signal CON3 having a logic "high" level to generate the second pulse signal PUL2 having a logic "high" level. The fourth logic unit 260 may receive the second pulse signal PUL2 having a logic "high" level and the power-up signal PWR having a logic "low" level to generate the fuse reset signal FZRST having a logic "high" level.

The internal voltage generator 31 of the fuse array portion 30 may generate the plurality of internal voltage signals VINT1, VINT2, . . . , and VINTn. The row path controller 32 may select one of the plurality of word lines WL<1:N> according to a level combination of the address signals ADD<1:N>. The column path controller 33 may receive the fuse reset signal FZRST having a logic "high" level to initialize the fuse data FZD<1:N>. In addition, the column path controller 33 may select one of the plurality of bit lines BL<1:N> according to a level combination of the address signals ADD<1:N>. Moreover, the column path controller 33 may sense and amplify the data on the selected bit line of the bit lines BL<1:N> to generate one of the fuse data FZD<1: N>. More specifically, the fuse array portion 30 may output the fuse data FZD<1:N> which are regenerated to have new information.

Figure 8:
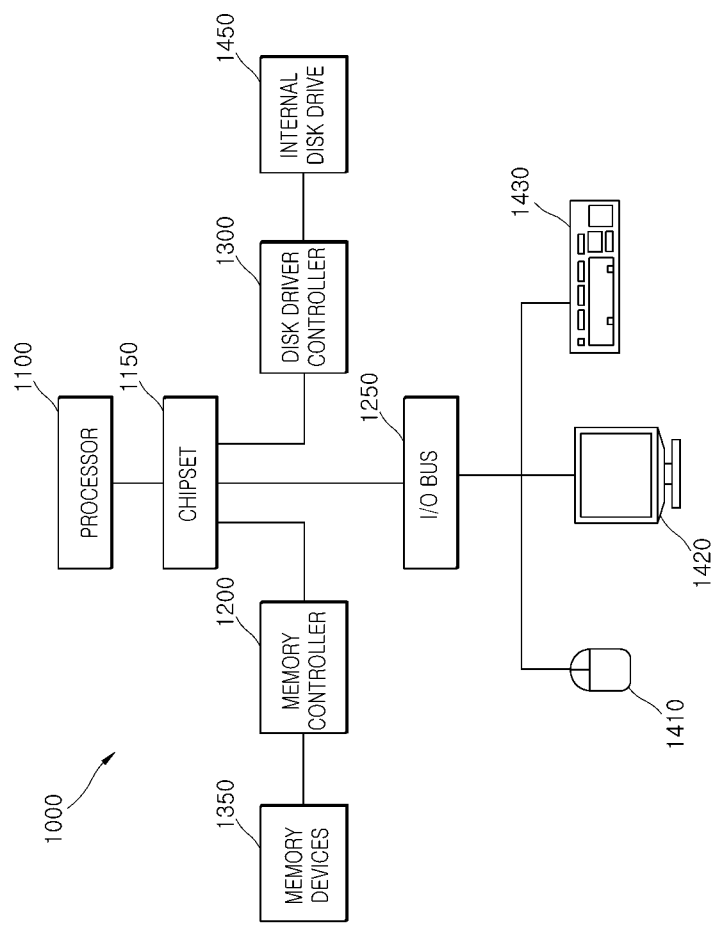
FIG. 8 illustrates a block diagram of a system employing a memory controller circuit in accordance with an embodiment of the invention.

Referring to FIG. 8, a system 1000 may include one or more processors 1100. The processor 1100 may be used individually or in combination with other processors. A chipset 1150 may be operably electrically coupled to the processor 1100. The chipset 1150 is a communication pathway for signals between the processor 1100 and other components of the system 1000. Other components may include a memory controller 1200, an input/output ("I/O") bus 1250 and a disk drive controller 1300. Depending on the configuration of the system 1000, any one of a number of different signals may be transmitted through the chipset 1150.

The memory controller 1200 may be operably electrically coupled to the chipset 1150. The memory controller 1200 can receive a request provided from the processor 1100 through the chipset 1150. The memory controller 1200 may be operably electrically coupled to one or more memory devices 1350. The memory devices 1350 may include the semiconductor device described above.

The chipset 1150 may also be electrically coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420 and 1430.

The disk drive controller 1300 may also be operably electrically coupled to the chipset 1150. The disk drive controller 1300 may serve as the communication pathway between the chipset 1150 and one or more internal disk drives 1450. The disk drive controller 1300 and the internal disk drives 1450 may communicate with each other or with the chipset 1150 using virtually any type of communication protocol.

According to the semiconductor device described above, the fuse data FZD<1:N> generated from the fuse array portion 30 are not initialized during the clock training operation. Accordingly, the boot-up operation may be stably executed.

What is claimed is:
1. A semiconductor device comprising:
a power control signal generator suitable to generate a power control signal enabled during a predetermined period from a termination moment of a power-up period and enabled in response to a test mode signal;
a fuse controller suitable to generate a boot-up signal enabled if a reboot-up signal is inputted during an enablement period of the power control signal and to generate a fuse reset signal enabled if a reset signal is inputted after a clock training operation; and
a fuse array portion suitable to generate a plurality of fuse data initialized if the fuse reset signal is enabled and programmed according to electrical open/short states of fuses in response to the power control signal.
2. The semiconductor device of claim 1, wherein the power control signal is a signal to generate internal voltage signals used in the fuse array portion.
3. The semiconductor device of claim 1, wherein the reboot-up signal is an external signal to generate and output the plurality of fuse data.
4. The semiconductor device of claim 1,
wherein the test mode signal includes a first test mode signal and a second test mode signal; and
wherein the power control signal generator includes:
a first latch unit suitable to generate a first control signal enabled in response to a power-up signal enabled at a termination moment of the power-up period and disabled in response to a mode set signal enabled after a predetermined period from a termination moment of the power-up period; and
a first logic unit suitable to generate the power control signal enabled in response to the first control signal or in response to the first test mode signal and the boot-up signal and disabled in response to the second test mode signal.
5. The semiconductor device of claim 4,
wherein the first test mode signal is a signal to execute a test mode that generates internal voltage signals used in the fuse array portion; and
wherein the second test mode signal is a signal to execute a test mode that interrupts generation of the internal voltage signals.
6. The semiconductor device of claim 4, wherein the first logic unit includes:
a first logic element suitable to generate a first enablement signal enabled in response to the boot-up signal or the first test mode signal;
a second logic element suitable to invert a level of the first enablement signal in response to the first control signal to generate a second enablement signal; and
a third logic element suitable to invert a level of the second enablement signal in response to the second test mode signal to generate the power control signal.
7. The semiconductor device of claim 1, wherein the fuse controller includes:
a boot-up signal generator suitable to generate the boot-up signal enabled if the reboot-up signal is inputted during an enablement period of the power control signal after the power-up period; and
a fuse reset signal generator suitable to generate the fuse reset signal enabled in response to the boot-up signal or in response to a clock enablement signal and the reset signal.
8. The semiconductor device of claim 7, wherein the boot-up signal generator includes:
a first pulse signal generator suitable to generate a first pulse signal including a pulse created in response to the reboot-up signal;

a second logic unit suitable to generate a second control signal enabled in response to the pulse of the first pulse signal during an enablement period of the power control signal; and a second latch unit suitable to generate the boot-up signal enabled in response to the second control signal.

9. The semiconductor device of claim 8, wherein the boot-up signal is disabled if at least one of the power control signal and the reboot-up signal has a logic "low" level.

10. A semiconductor device comprising:
a fuse controller suitable to generate a boot-up signal enabled in response to a reboot-up signal after a power-up period and to generate a fuse reset signal enabled if the boot-up signal is enabled or if a reset signal is inputted after a clock training operation; and
a fuse array portion suitable to generate a plurality of fuse data initialized if the fuse reset signal is enabled and which are programmed according to electrical open/short states of fuses in response to a power control signal.

11. The semiconductor device of claim 10, wherein the reboot-up signal is an external signal to generate and output the plurality of fuse data.

12. The semiconductor device of claim 10, further comprising:
a power control signal generator suitable to generate the power control signal enabled during a predetermined period from a termination moment of the power-up period and enabled in response to a test mode signal.

13. The semiconductor device of claim 12,
wherein the test mode signal includes a first test mode signal and a second test mode signal; and
wherein the power control signal generator includes:
a first latch unit suitable to generate a first control signal enabled in response to a power-up signal enabled at a termination moment of the power-up period and disabled in response to a mode set signal enabled after a predetermined period from a termination moment of the power-up period; and
a first logic unit suitable to generate the power control signal enabled in response to the first control signal or in response to the first test mode signal and the boot-up signal and disabled in response to the second test mode signal.

14. The semiconductor device of claim 13,
wherein the first test mode signal is a signal to execute a test mode that generates internal voltage signals used in the fuse array portion; and
wherein the second test mode signal is a signal to execute a test mode that interrupts generation of the internal voltage signals.

15. The semiconductor device of claim 13, wherein the first logic unit includes:
a first logic element suitable to generate a first enablement signal enabled in response to the boot-up signal or the first test mode signal;
a second logic element suitable to invert a level of the first enablement signal in response to the first control signal to generate a second enablement signal; and
a third logic element suitable to invert a level of the second enablement signal in response to the second test mode signal to generate the power control signal.

16. The semiconductor device of claim 10, wherein the fuse controller includes:
a boot-up signal generator suitable to generate the boot-up signal enabled if the reboot-up signal is inputted during an enablement period of the power control signal to generate internal voltage signals used in the fuse array portion after the power-up period; and
a fuse reset signal generator suitable to generate the fuse reset signal enabled in response to the boot-up signal or in response to a clock enablement signal and the reset signal.

17. The semiconductor device of claim 16, wherein the boot-up signal generator includes:
a first pulse signal generator suitable to generate a first pulse signal including a pulse created in response to the reboot-up signal;
a second logic unit suitable to generate a second control signal enabled in response to the pulse of the first pulse signal during an enablement period of the power control signal; and
a second latch unit suitable to generate the boot-up signal enabled in response to the second control signal.

18. The semiconductor device of claim 17, wherein the boot-up signal is disabled if at least one of the power control signal and the reboot-up signal has a logic "low" level.

19. The semiconductor device of claim 16, wherein the fuse reset signal generator includes:
a third logic unit suitable to generate a third control signal enabled in response to the clock enablement signal if the reset signal is inputted;
a second pulse signal generator suitable to generate a second pulse signal including a pulse created if the boot-up signal or the third control signal is enabled; and
a fourth logic unit suitable to generate the fuse reset signal enabled if the pulse of the second pulse signal is created in response to a power-up signal.

20. The semiconductor device of claim 19, wherein the clock enablement signal is enabled after the clock training operation.

* * * * *